(12) United States Patent
Kok

(10) Patent No.: US 8,909,169 B2
(45) Date of Patent: Dec. 9, 2014

(54) OPTIMIZING ISOLATION AND INSERTION LOSS OF A RADIO FREQUENCY SINGLE POLE-DOUBLE-THROW SWITCH

(71) Applicant: Microchip Technology Incorporated, Chandler, AZ (US)

(72) Inventor: Yon-Lin Kok, Cerritos, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 90 days.

(21) Appl. No.: 13/787,803

(22) Filed: Mar. 7, 2013

(65) Prior Publication Data

US 2014/0256272 A1    Sep. 11, 2014

(51) Int. Cl.
*H04B 1/44* (2006.01)

(52) U.S. Cl.
CPC ........................... *H04B 1/44* (2013.01)
USPC ................. 455/78; 455/73; 455/82; 327/283; 333/103

(58) Field of Classification Search
CPC ...... H04B 1/52; H04B 7/0686; H04B 7/0817; H04B 7/0831; H04B 7/086; H04B 7/0868
USPC ......... 455/78–82, 73; 327/283, 278; 333/103, 333/262
See application file for complete search history.

(56) References Cited

U.S. PATENT DOCUMENTS

| | | | | |
|---|---|---|---|---|
| 5,513,637 | A * | 5/1996 | Twiss et al. | 600/424 |
| 5,594,394 | A * | 1/1997 | Sasaki et al. | 333/103 |
| 6,496,684 | B2 * | 12/2002 | Nakao et al. | 455/78 |
| 6,614,237 | B2 * | 9/2003 | Ademian et al. | 324/601 |
| 7,768,792 | B2 * | 8/2010 | Kim et al. | 361/760 |
| 8,207,781 | B2 * | 6/2012 | Noh et al. | 327/436 |
| 8,411,602 | B2 * | 4/2013 | Okawa et al. | 370/280 |
| 2001/0049265 | A1 * | 12/2001 | Nakao et al. | 455/73 |
| 2002/0053898 | A1 * | 5/2002 | Ademian et al. | 324/76.19 |
| 2004/0235549 | A1 | 11/2004 | Struble et al. | 463/16 |

(Continued)

FOREIGN PATENT DOCUMENTS

| | | | | |
|---|---|---|---|---|
| JP | 09321829 A | 12/1997 | | H01P 1/15 |
| JP | 3630797 B2 | 3/2005 | | H01P 1/15 |

OTHER PUBLICATIONS

Uda, Hisanori et al., "A High-Performance and Miniaturized Dual-Use (Antenna/Local) GaAs SPDT Switch IC Operating at +3V/0V," IEEE 1996 Microwave and Millimeter-Wave Monolithic Circuits Symposium, 4 pages, Jan. 1, 1996.

(Continued)

*Primary Examiner* — Minh D Dao
(74) *Attorney, Agent, or Firm* — King & Spalding L.L.P.

(57) ABSTRACT

A single pole double throw (SPDT) switch is fabricated on an integrated circuit (IC) and may comprise two radio frequency (RF) switching devices each having a separate DC blocking capacitor coupled between respective RF switching devices and a common node. A DC connection is provided between the two RF switching devices with a thin electrically conductive line. This thin electrically conductive line provides for increased isolation between the two RF switching devices and decreased insertion loss. The increased isolation and/or decreased insertion loss is accomplished by tuning the thin electrically conductive line through the characteristic impedance of the line when impedance matching conditions are met. Undesired circuit resonance(s) in the SPDT switch may be substantially reduced by using two or more thin electrically conductive lines that further reduce the thin electrically line(s) inductance.

22 Claims, 5 Drawing Sheets

(56) References Cited

U.S. PATENT DOCUMENTS

| | | | |
|---|---|---|---|
| 2008/0055024 A1* | 3/2008 | Kersten | 335/79 |
| 2009/0274075 A1* | 11/2009 | Okawa et al. | 370/280 |
| 2011/0086596 A1 | 4/2011 | Liao et al. | 455/83 |
| 2011/0140763 A1* | 6/2011 | Noh et al. | 327/434 |
| 2012/0008937 A1* | 1/2012 | Cheng et al. | 398/1 |
| 2012/0262217 A1 | 10/2012 | Gorbachov et al. | 327/382 |

OTHER PUBLICATIONS

International Search Report and Written Opinion, Application No. PCT/US2014/019493, 14 pages, Aug. 6, 2014.

* cited by examiner

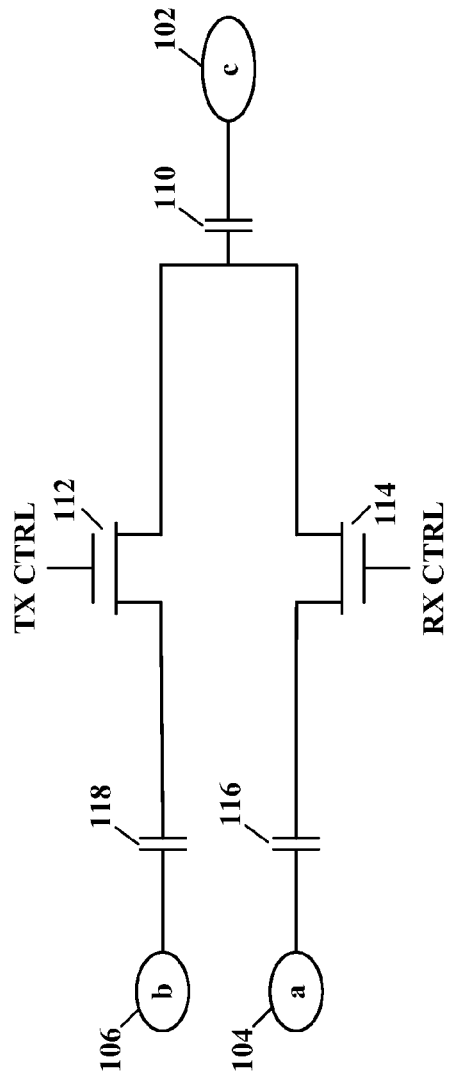
Figure 1 (Prior Technology)
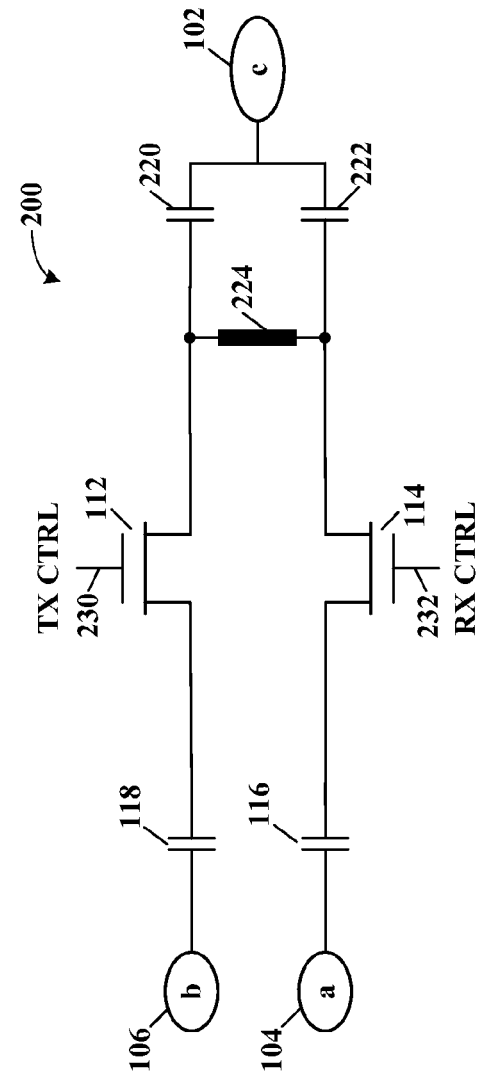
Figure 2

OPTIMIZING ISOLATION AND INSERTION LOSS OF A RADIO FREQUENCY SINGLE POLE-DOUBLE-THROW SWITCH

TECHNICAL FIELD

The present disclosure relates to radio frequency (RF) devices, and, more particularly, to a way of optimizing isolation and insertion loss of a radio frequency single-pole-double-throw switch used in an integrated circuit RF front end module (FEM) of the RF device.

BACKGROUND

Miniaturization of RF integrated circuit (IC) design for a single pole double throw (SPDT) switch makes it difficult to maintain both good isolation and low insertion loss of a RF switch fabricated on an IC. Referring to FIG. 1, depicted is prior technology single pole double throw (SPDT) RF switch fabricated on an integrated circuit IC. This prior technology SPDT RF switch comprises a first node 102, a second node 104 and a third node 106. Switching actions between nodes 102 and 104, or nodes 102 and 106 are may be performed with metal oxide semiconductor field effect transistor (MOSFET) RF switches 112 and 114. The MOSFET RF switches are direct current (DC) voltage blocked from the nodes 102, 104 and 106 with DC blocking capacitors 110, 116 and 118, respectively.

The DC blocking capacitor 110 is shared by both MOSFET RF switches 112 and 114 where the DC connection between the two MOSFET RF switches 112 and 114 is provided by a plate of the capacitor 110. This type of DC physical connection results in poor RF signal isolation between the MOSFET RF switches 112 and 114, resulting in poor RF signal isolation between the nodes 104 and 106.

SUMMARY

Therefore a need exists for a way to improve RF signal isolation between nodes of a RF switch fabricated on an integrated circuit die.

According to an embodiment, a radio frequency (RF) single-pole-double-throw (SPDT) switch may comprise: a first node; a first RF switching device; a second RF switching device; a first direct current (DC) blocking capacitor coupled between the first node and the first RF switching device; a second DC blocking capacitor coupled between the first node and the second RF switching device; a second node; a third DC blocking capacitor coupled between the second node and the first RF switching device; a third node; a fourth DC blocking capacitor coupled between the third node and the second RF switching device; and a thin electrically conductive line having a first end coupled between the first DC blocking capacitor and the first RF switching device, and a second end thereof coupled between the second DC blocking capacitor and the second RF switching device, wherein the thin electrically conductive line provides a DC path between the first and second RF switching devices.

According to a further embodiment, the first and second RF switching devices comprise first and second metal oxide semiconductor field effect transistors (MOSFETs). According to a further embodiment, the first and second MOSFETs comprise complementary metal oxide semiconductor (CMOS) MOSFETs. According to a further embodiment, the first and second RF switching devices operate at gigahertz frequencies. According to a further embodiment, the thin electrically conductive line may be about four micrometers in width. According to a further embodiment, the thin electrically conductive line length may be adjusted for best isolation between the second and third nodes. According to a further embodiment, the thin electrically conductive line length may be adjusted to reduced insertion loss between the first and second nodes, and the first and third nodes. According to a further embodiment, the RF SPDT switch may be fabricated on an integrated circuit die.

According to another embodiment, a radio frequency (RF) single-pole-double-throw (SPDT) switch may comprise: a first node; a first RF switching device; a second RF switching device; a first direct current (DC) blocking capacitor coupled between the first node and the first RF switching device; a second DC blocking capacitor coupled between the first node and the second RF switching device; a second node; a third DC blocking capacitor coupled between the second node and the first RF switching device; a third node; a fourth DC blocking capacitor coupled between the third node and the second RF switching device; and first and second thin electrically conductive lines having first ends coupled between the first DC blocking capacitor and the first RF switching device, and second ends thereof coupled between the second DC blocking capacitor and the second RF switching device, wherein the first and second thin electrically conductive lines provide a DC path between the first and second RF switching devices.

According to a further embodiment, the first and second RF switching devices comprise first and second metal oxide semiconductor field effect transistors (MOSFETs). According to a further embodiment, the first and second MOSFETs comprise complementary metal oxide semiconductor (CMOS) MOSFETs. According to a further embodiment, the first and second RF switching devices operate at gigahertz frequencies. According to a further embodiment, each of the first and second thin electrically conductive lines may be about four micrometers in width. According to a further embodiment, the first and second thin electrically conductive line lengths may be adjusted for best isolation between the second and third nodes, reduced insertion loss between the first and second nodes, and reduced insertion loss between the first and third nodes. According to a further embodiment, the RF SPDT switch may be fabricated on an integrated circuit die.

According to yet another embodiment, a radio frequency (RF) single-pole-double-throw (SPDT) switch may comprise: a first node; a first RF switching device; a second RF switching device; a first direct current (DC) blocking capacitor coupled between the first node and the first RF switching device; a second DC blocking capacitor coupled between the first node and the second RF switching device; a second node; a third DC blocking capacitor coupled between the second node and the first RF switching device; a third node; a fourth DC blocking capacitor coupled between the third node and the second RF switching device; and a plurality of thin electrically conductive lines having first ends coupled between the first DC blocking capacitor and the first RF switching device, and second ends thereof coupled between the second DC blocking capacitor and the second RF switching device, wherein the plurality of thin electrically conductive lines provide a DC path between the first and second RF switching devices.

According to a further embodiment, the first and second RF switching devices comprise first and second metal oxide semiconductor field effect transistors (MOSFETs). According to a further embodiment, the first and second MOSFETs comprise complementary metal oxide semiconductor (CMOS) MOSFETs. According to a further embodiment, the first and second RF switching devices operate at gigahertz frequencies. According to a further embodiment, each of the first and second thin electrically conductive lines may be about four micrometers in width. According to a further embodiment, the plurality of thin electrically conductive line lengths may be adjusted for best isolation between the second and third nodes, reduced insertion loss between the first and second nodes, and reduced insertion loss between the first and third nodes. According to a further embodiment, the RF SPDT switch may be fabricated on an integrated circuit die.

BRIEF DESCRIPTION OF THE DRAWINGS

A more complete understanding of the present disclosure may be acquired by referring to the following description taken in conjunction with the accompanying drawings wherein:

FIG. 1 illustrates a schematic diagram of a prior technology single pole double throw (SPDT) switch fabricated on an integrated circuit IC;

FIG. 2 illustrates a schematic diagram of a single pole double throw (SPDT) switch fabricated on an integrated circuit (IC), according to a specific example embodiment of this disclosure;

Figure 3:
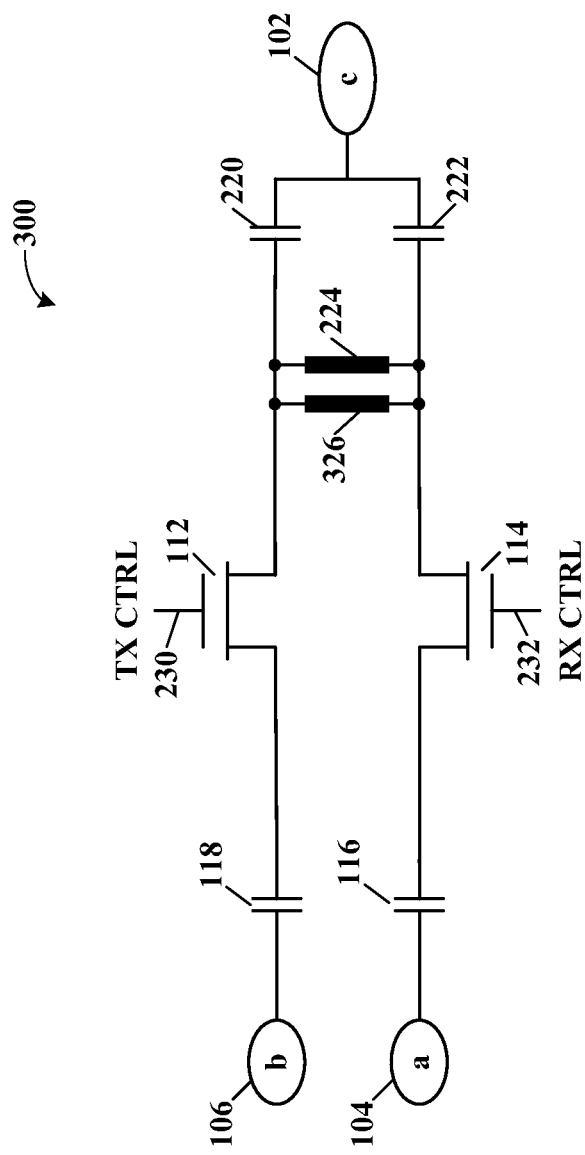
FIG. 3 illustrates a schematic diagram of a single pole double throw (SPDT) switch fabricated on an integrated circuit (IC), according to another specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Each of two RF switching devices, e.g., MOSFET RF switches, is provided with a separate associated blocking capacitor coupled to a common node. A DC connection is provided between the two RF switching devices is with a thin electrically conductive line. Thereby isolation between the two RF switching devices may be increased and insertion loss associated with the two RF switching devices may be reduced by tuning this thin electrically conductive line through the characteristic impedance of the line when impedance matching conditions are met. Undesired circuit resonance(s) may be substantially reduced by using two or more thin electrically conductive lines that further reduce the thin electrically line(s) inductance.

Referring now to the drawings, the details of specific example embodiments are schematically illustrated. Like elements in the drawings will be represented by like numbers, and similar elements will be represented by like numbers with a different lower case letter suffix.

Referring to FIG. 2, depicted is a schematic diagram of a single pole double throw (SPDT) switch fabricated on an integrated circuit (IC), according to a specific example embodiment of this disclosure. A SPDT RF switch, generally represented by the numeral 200, may comprise a first node 102, a second node 104 and a third node 106. Switching actions between nodes 102 and 104, or nodes 102 and 106 may be performed with two RF switching devices (e.g., MOSFET RF switches) 114 and 112, respectively. Each of the two RF switching devices 112 and 114 is provided with a separate associated DC blocking capacitor coupled to the common node 102. The MOSFET RF switching device 112 is DC voltage blocked from the node 102 with DC blocking capacitor 220, and from the node 106 with DC voltage blocking capacitor 118. The MOSFET RF switching device 114 is DC voltage blocked from the node 102 with DC voltage blocking capacitor 222, and from the node 104 with DC voltage blocking capacitor 116.

A DC connection is provided between the two RF switching devices 112 and 114 with a thin electrically conductive line 224. The physical characteristics, e.g., length and width, may be optimized for best isolation between the two RF switching devices 112 and 114, and reduced insertion loss through the two RF switching devices 112 and 114 by tuning this thin electrically conductive line through the characteristic impedance of the line when impedance matching conditions are met. The thin electrically conductive line 224 may be, for example but not limited to, about 4 micrometers in width, and coupled between the elements, e.g., source/drain, of the two RF switching devices 112 and 114.

Referring to FIG. 3, depicted is a schematic diagram of a single pole double throw (SPDT) switch fabricated on an integrated circuit (IC), according to another specific example embodiment of this disclosure. A SPDT RF switch, generally represented by the numeral 300, may comprise a first node 102, a second node 104 and a third node 106. The SPDT switch circuit shown in FIG. 3 functions in substantially the same way as the SPDT switch circuit shown in FIG. 2, but with the addition of a second thin electrically conductive line 326 that further provides a DC connection between the two RF switching devices 112 and 114. This second thin electrically conductive line 326 further reduces the inductance of the DC connections between the two RF switching devices 112 and 114, whereby undesired circuit resonance(s) may be reduced by using two thin electrically conductive lines 224 and 326. It is contemplated and within the scope of this disclosure that a plurality of thin electrically conductive lines may be used to reduce the inductance of the DC connection between the two RF switching devices 112 and 114.

The SPDT switches 200 and 300 described hereinabove may be fabricated along with other components of a RF front end module (FEM) (not shown) on an integrated circuit die (dice) and packaged in an integrated circuit package (not shown). The SPDT switches 200 and 300 may be, for example but are not limited to, two metal oxide semiconductor field effect transistor (MOSFET) RF switching devices 112 and 114 that may be arranged with a common source input and isolated independent drain outputs, a common drain input and isolated independent source outputs. These MOSFET RF switching devices 112 and 114 may operate at microwave frequencies, e.g., 2 to 6 GHz. The MOSFET RF switching devices 112 and 114 may be single gate, double gate, triple gate, etc., transistors. The MOSFET RF switching devices 112 and 114 may also be configured as complementary metal oxide semiconductor field effect transistor (CMOS FET) switches. Each of the MOSFET RF switching devices 112 and 114 may be controlled through gates 330 and 332, respectively.

Figure 4:
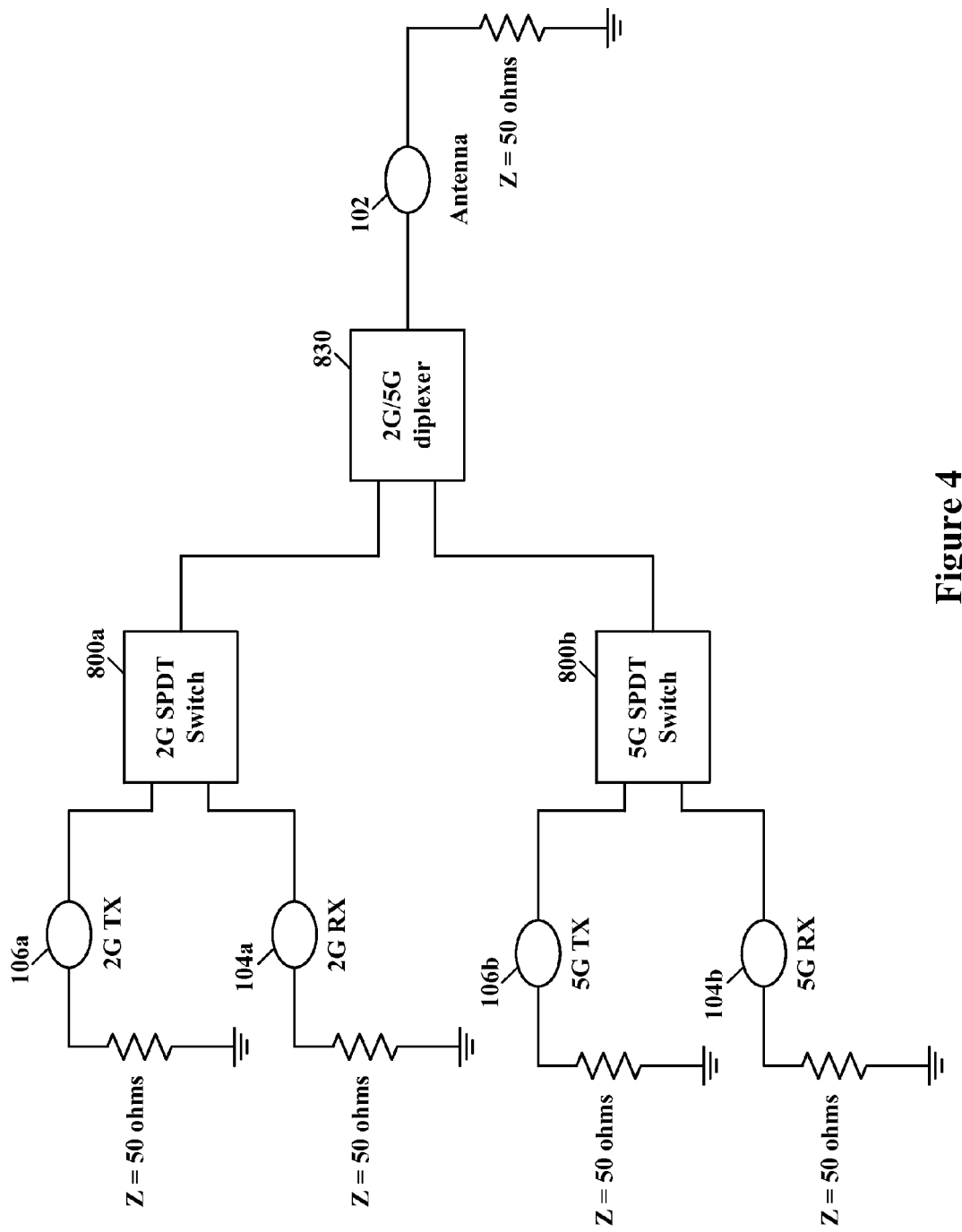
FIG. 4 illustrates a schematic block diagram of 2G and 5G single pole double throw (SPDT) switches and a 2G/5G diplexer according to the specific example embodiments of this disclosure.

Referring to FIG. 4, depicted is a schematic block diagram of 2G and 5G single pole double throw (SPDT) switches and a 2G/5G diplexer according to the specific example embodiments of this disclosure. A 2G switch 800a is coupled between a 2G/5G diplexer 830, and 2G transmit and receive ports 106a and 104a, respectively. A 5G switch 800b is coupled between the 2G/5G diplexer 830, and 5G transmit and receive ports 106b and 104b, respectively. The 2G/5G diplexer 830 is further coupled to a dual band antenna port 102.

Figure 5:
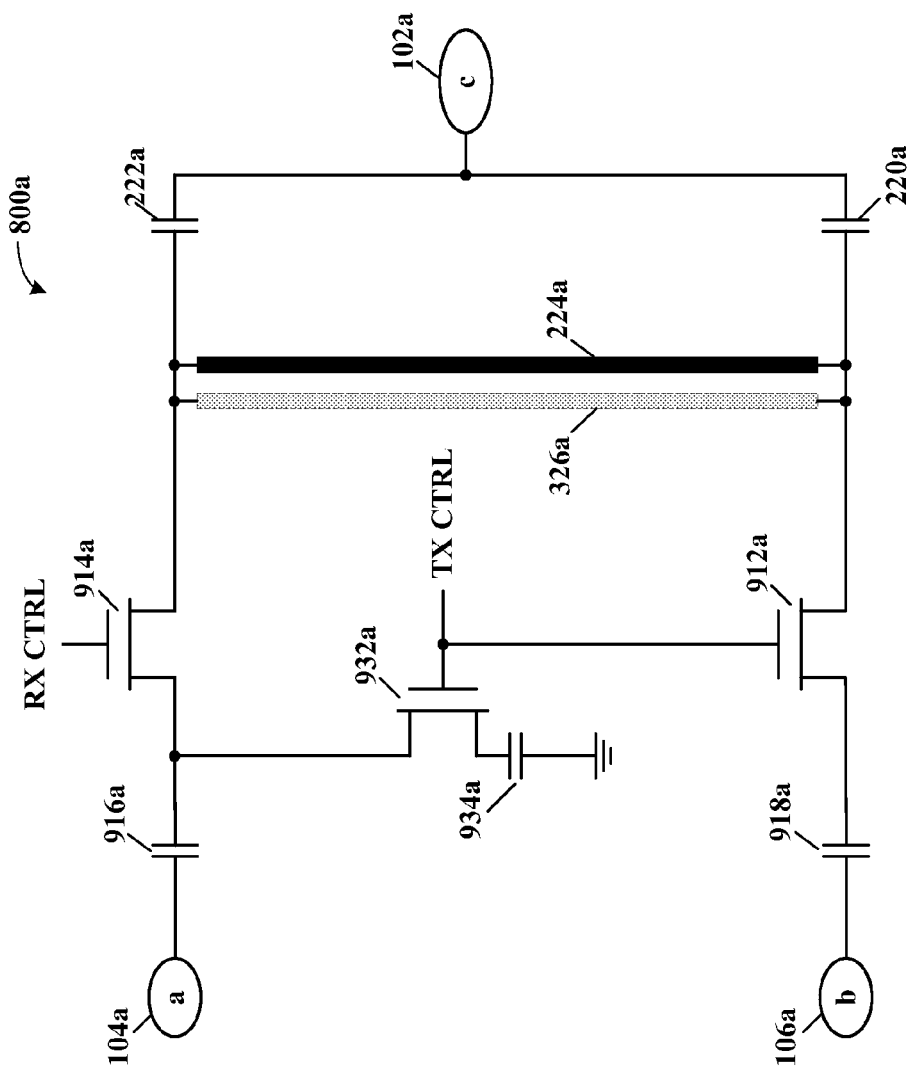
FIG. 5 illustrates a more detailed schematic diagram of the 2G single pole double throw (SPDT) switch shown in FIG. 4, according to the specific example embodiments of this disclosure.

Referring to FIG. 5, depicted is a more detailed schematic diagram of the 2G single pole double throw (SPDT) switch shown in FIG. 4, according to the specific example embodiments of this disclosure. A 2G SPDT RF switch, generally represented by the numeral 800a, may comprise a first node 102a, a second node 104a and a third node 106a. Switching actions between nodes 102a and 104a, or nodes 102a and 106a may be performed with two RF switching devices (e.g., MOSFET RF switches) 914a and 912a, respectively. Each of the two RF switching devices 912a and 914a is provided with a separate associated DC blocking capacitor coupled to the common node 102a. The MOSFET RF switching device 912a is DC voltage blocked from the node 102a with DC blocking capacitor 220a, and from the node 106a with DC voltage blocking capacitor 918a. The MOSFET RF switching device 914a is DC voltage blocked from the node 102a with DC voltage blocking capacitor 222a, and from the node 104a with DC voltage blocking capacitor 916a. A further MOSFET RF switching device 932a may be used to prevent damage to the receive node 104a when the 2G transmitter (not shown) is transmitting into node 106a. The MOSFET RF switching device 932a may be DC voltage blocked with DC blocking capacitor 934a. The thin conductor(s) 224a (and 326a) function as described hereinabove.

Figure 6:
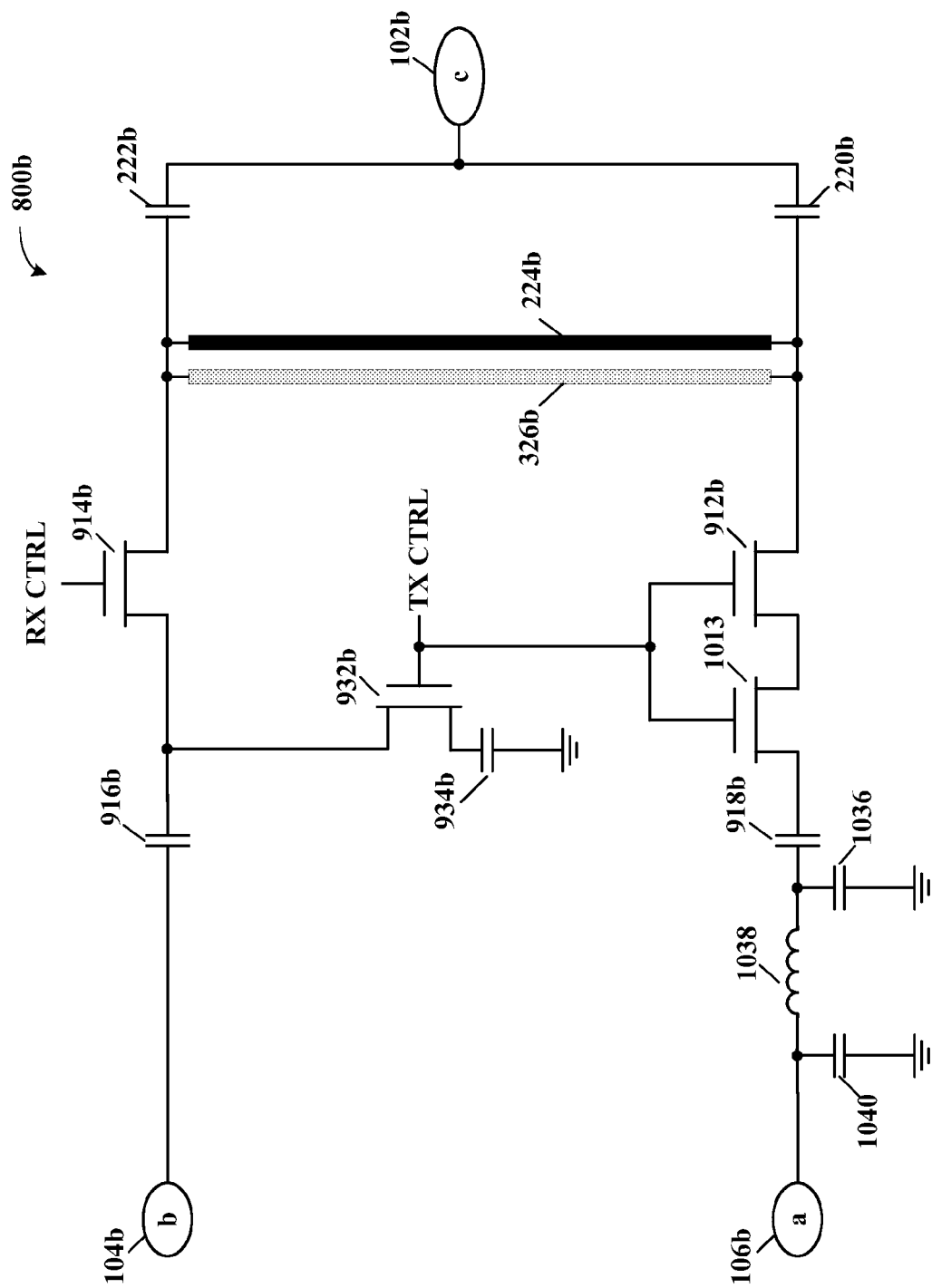
FIG. 6 illustrates a more detailed schematic diagram of the 5G single pole double throw (SPDT) switch shown in FIG. 4, according to the specific example embodiments of this disclosure.

Referring to FIG. 6, depicted is a more detailed schematic diagram of the 5G single pole double throw (SPDT) switch shown in FIG. 4, according to the specific example embodiments of this disclosure. A 5G SPDT RF switch, generally represented by the numeral 800b, may comprise a first node 102b, a second node 104b and a third node 106b. Switching action between nodes 102b and 104b may be performed with an RF switching device (e.g., MOSFET RF switch) 914b. Switching action between nodes 102b and 106b may be performed with series connected RF switching devices (e.g., MOSFET RF switches) 912b and 1013. The RF switching devices 912a, and series connected RF switching devices 914a and 1013 are provided with a separate associated DC blocking capacitors coupled to the common node 102a. The MOSFET RF switching devices 912a and 1013 are DC voltage blocked from the node 102b with DC blocking capacitor 220b, and from the node 106b with DC voltage blocking capacitor 918b. The MOSFET RF switching device 914b is DC voltage blocked from the node 102b with DC voltage blocking capacitor 222ba, and from the node 104b with DC voltage blocking capacitor 916b. A further MOSFET RF switching device 932b may be used to prevent damage to the receive node 104b when the 5G transmitter (not shown) is transmitting into node 106b. The MOSFET RF switching device 932b may be DC voltage blocked with DC blocking capacitor 934b. The thin conductor(s) 224a (and 326a) function as described hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A radio frequency (RF) single-pole-double-throw (SPDT) switch, comprising:
    a first node;
    a first RF switching device;
    a second RF switching device;
    a first direct current (DC) blocking capacitor coupled between the first node and the first RF switching device;
    a second DC blocking capacitor coupled between the first node and the second RF switching device;
    a second node;
    a third DC blocking capacitor coupled between the second node and the first RF switching device;
    a third node;
    a fourth DC blocking capacitor coupled between the third node and the second RF switching device; and
    a thin electrically conductive line having a first end coupled between the first DC blocking capacitor and the first RF switching device, and a second end thereof coupled between the second DC blocking capacitor and the second RF switching device, wherein the thin electrically conductive line provides a DC path between the first and second RF switching devices.

2. The RF SPDT switch according to claim 1, wherein the first and second RF switching devices comprise first and second metal oxide semiconductor field effect transistors (MOSFETs).

3. The RF SPDT switch according to claim 2, wherein the first and second MOSFETs comprise complementary metal oxide semiconductor (CMOS) MOSFETs.

4. The RF SPDT switch according to claim 1, wherein the first and second RF switching devices operate at gigahertz frequencies.

5. The RF SPDT switch according to claim 1, wherein the thin electrically conductive line is about four micrometers in width.

6. The RF SPDT switch according to claim 1, wherein the thin electrically conductive line length is adjusted for best isolation between the second and third nodes.

7. The RF SPDT switch according to claim 1, wherein the thin electrically conductive line length is adjusted to reduced insertion loss between the first and second nodes, and the first and third nodes.

8. The RF SPDT switch according to claim 1, wherein the RF SPDT switch is fabricated on an integrated circuit die.

9. A radio frequency (RF) single-pole-double-throw (SPDT) switch, comprising:
    a first node;
    a first RF switching device;
    a second RF switching device;
    a first direct current (DC) blocking capacitor coupled between the first node and the first RF switching device;
    a second DC blocking capacitor coupled between the first node and the second RF switching device;
    a second node;
    a third DC blocking capacitor coupled between the second node and the first RF switching device;
    a third node;

a fourth DC blocking capacitor coupled between the third node and the second RF switching device; and first and second thin electrically conductive lines having first ends coupled between the first DC blocking capacitor and the first RF switching device, and second ends thereof coupled between the second DC blocking capacitor and the second RF switching device, wherein the first and second thin electrically conductive lines provide a DC path between the first and second RF switching devices.

10. The RF SPDT switch according to claim 9, wherein the first and second RF switching devices comprise first and second metal oxide semiconductor field effect transistors (MOSFETs).

11. The RF SPDT switch according to claim 10, wherein the first and second MOSFETs comprise complementary metal oxide semiconductor (CMOS) MOSFETs.

12. The RF SPDT switch according to claim 9, wherein the first and second RF switching devices operate at gigahertz frequencies.

13. The RF SPDT switch according to claim 9, wherein each of the first and second thin electrically conductive lines is about four micrometers in width.

14. The RF SPDT switch according to claim 9, wherein the first and second thin electrically conductive line lengths are adjusted for best isolation between the second and third nodes, reduced insertion loss between the first and second nodes, and reduced insertion loss between the first and third nodes.

15. The RF SPDT switch according to claim 9, wherein the RF SPDT switch is fabricated on an integrated circuit die.

16. A radio frequency (RF) single-pole-double-throw (SPDT) switch, comprising:
    a first node;
    a first RF switching device;
    a second RF switching device;
    a first direct current (DC) blocking capacitor coupled between the first node and the first RF switching device;
    a second DC blocking capacitor coupled between the first node and the second RF switching device;
    a second node;
    a third DC blocking capacitor coupled between the second node and the first RF switching device;
    a third node;
    a fourth DC blocking capacitor coupled between the third node and the second RF switching device; and
    a plurality of thin electrically conductive lines having first ends coupled between the first DC blocking capacitor and the first RF switching device, and second ends thereof coupled between the second DC blocking capacitor and the second RF switching device, wherein the plurality of thin electrically conductive lines provide a DC path between the first and second RF switching devices.

17. The RF SPDT switch according to claim 16, wherein the first and second RF switching devices comprise first and second metal oxide semiconductor field effect transistors (MOSFETs).

18. The RF SPDT switch according to claim 17, wherein the first and second MOSFETs comprise complementary metal oxide semiconductor (CMOS) MOSFETs.

19. The RF SPDT switch according to claim 16, wherein the first and second RF switching devices operate at gigahertz frequencies.

20. The RF SPDT switch according to claim 16, wherein each of the first and second thin electrically conductive lines is about four micrometers in width.

21. The RF SPDT switch according to claim 16, wherein the plurality of thin electrically conductive line lengths are adjusted for best isolation between the second and third nodes, reduced insertion loss between the first and second nodes, and reduced insertion loss between the first and third nodes.

22. The RF SPDT switch according to claim 16, wherein the RF SPDT switch is fabricated on an integrated circuit die.

* * * * *